(12) United States Patent
Ito (10) Patent No.: US 7,837,334 B2
(45) Date of Patent: Nov. 23, 2010

(54) PROJECTOR AND DISPLAY DEVICE

(75) Inventor: Yoshitaka Ito, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 393 days.

(21) Appl. No.: 12/147,009

(22) Filed: Jun. 26, 2008

(65) Prior Publication Data

US 2009/0051880 A1    Feb. 26, 2009

(30) Foreign Application Priority Data

Aug. 21, 2007   (JP) ............... 2007-214511

(51) Int. Cl.
*G03B 21/16*   (2006.01)
(52) U.S. Cl. .......................... 353/52; 353/56
(58) Field of Classification Search ............ 353/52, 353/56, 31, 20; 349/20, 21, 22; 359/443
See application file for complete search history.

(56) References Cited

U.S. PATENT DOCUMENTS

2003/0179345 A1*   9/2003   Ito et al. .............. 353/20

FOREIGN PATENT DOCUMENTS

| JP | 11-231277 | 8/1999 |
|---|---|---|
| JP | 2001-318359 | 11/2001 |

* cited by examiner

*Primary Examiner*—Kevin Pyo
(74) *Attorney, Agent, or Firm*—AdvantEdge Law Group, LLC (57) ABSTRACT

A projector includes a transmissive heat exchange element having a transparent thermoelectric conversion layer consisting mainly of an oxide and an electrode for supplying the transparent thermoelectric conversion layer with a current, and an optical element, and cooling or heating of the optical element is performed using the transmissive heat exchange element.

12 Claims, 6 Drawing Sheets

PROJECTOR AND DISPLAY DEVICE

BACKGROUND

1. Technical Field

The present invention relates to a projector and a display device, and in particular to a projector and a display device each having a temperature control structure with good efficiency of an optical element and being superior in thermal reliability.

2. Related Art

A projector in which a liquid crystal light valve is irradiated with light from a light source such as a high pressure mercury lamp or xenon lamp, and an image formed on the liquid crystal valve is enlargedly displayed on a screen by a projection lens or the like has been put into practice. While increase in brightness of the display image, namely increase in output of the light source, is in progress in order for making a projection image be viewed on a large screen even in a bright room, downsizing of the projector and the liquid crystal light valve is also in progress in order for making it easy to transport and handle the projector device. Therefore, the light with extremely high intensity has been getting to enter the optical elements positioned on in the illumination or on the projection light path, such as a liquid crystal light valve, a polarization plate, or a polarization conversion element. However, since a part of or a large proportion of the incident light is converted into heat in these optical elements, degradation or deterioration of the optical characteristics and shorter operation lives of the optical elements caused by heat charge of the optical elements have become big problems.

In order for preventing the heat charge of the optical elements, there are invented measures such that the optical elements are cooled using a large sized air-cooling fan with a high cooling capability, or that a crystalline substrate with high thermal conductivity (i.e., a heat radiation property) such as sapphire is used as the substrate for holding the polarization plate or the polarization conversion element (e.g., JP-A-11-231277 and JP-A-2110-318359).

However, in the former measure, there are problems that it is incompatible with downsizing of the projector device, and further, that increase in noise in accordance with increase in cooling capability can hardly be avoided. Further, in the latter measure, there is a problem that, since the heat is conducted and radiated naturally (in an unforced manner) in accordance with the heat distribution gradient caused in the crystalline substrate, sufficient heat radiation is not achievable in the case in which the amount of heat generation is extremely large, thus the heat charge cannot sufficiently be prevented.

SUMMARY

An advantage of some aspects of the invention is to provide a projector and an image display device capable of preventing degradation of the characteristics or deterioration of the characteristics, and reduction of operation lives of optical elements, thus performing high quality image display over a long period of time even in the case in which a high power light source is used. Further, another advantage of the invention is to provide a projector and a display device capable of further downsizing owing to improvement of the cooling efficiency.

In order for obtaining the advantage, a projector according to an aspect of the invention includes a transmissive heat exchange element having a transparent thermoelectric conversion layer consisting mainly of an oxide and an electrode for supplying the transparent thermoelectric conversion layer with a current, and an optical element, and cooling or heating of the optical element is performed using the transmissive heat exchange element.

Since the typical Peltier element known from the past is an opaque element consisting mainly of, for example, a bismuth-tellurium alloy or the like, it has not been used in the light path through which the light is transmitted. Meanwhile, a transparent thermoelectric conversion material consisting mainly of an oxide and expressing the Peltier effect (the energy distribution (heat distribution) is formed in response to application of an electrical current, thus the heat generating section and the heat absorbing section are formed) has been recently developed. Since the thermoelectric conversion material consisting mainly of the oxide is transparent in the visible range, it can be used as the transmissive heat exchange element, and by applying a current using electrodes, it can actively cool or heat an optical element. Therefore, by temperature-controlling the optical element influenced in the optical characteristic by temperature using the transmissive heat exchange element of this kind, a projector achieving stabilization of the optical characteristic and increase in operation life can be realized.

The transmissive heat exchange element can have configuration of being disposed in close contact with the optical element, or disposed adjacent to the optical element.

According to the present configuration, the optical element can efficiently be cooled or heated without changing the configuration of the existing projector.

Further, there can be adopted a configuration in which the transmissive heat exchange element is disposed each of both surfaces of the optical element, and a temperature distribution of the transmissive heat exchange element is formed so that the side of the transmissive heat exchange element opposed to the optical element becomes a low temperature side. Here, "both surfaces of the optical element" denotes the entrance surface and the exit surface of the optical elements.

According to the present configuration, the optical element can efficiently be cooled. Further, since the temperature difference between the both surfaces of the optical element is reduced, the stress or the distortion, which influences the optical characteristics, can be prevented from being generated, thus the deterioration of the image quality of the display image can be prevented.

Alternatively, the transmissive heat exchange element can be used as the transparent substrate forming the optical element.

According to this configuration, since the transmissive heat exchange element is used as the transparent substrate forming the optical element, reduction of the number of constituent parts and downsizing of the device can be achieved in comparison with, for example, the case in which the transmissive heat exchange element is disposed in close contact with the optical element.

Further, there can be adopted the configuration in which a temperature detection section for detecting the temperature of the optical element is provided, and the current is controlled based on the detection result of the temperature detection section, thereby controlling the temperature of the transmissive heat exchange element.

This configuration is preferable for the case in which the optical element has a temperature range, which is most suitable for the optical element to exert the preferable characteristics, for example. According to this configuration, since the current is controlled based on the detection result of the temperature detection section and the temperature of the transmissive heat exchange element is controlled, the optical element can accurately be temperature-controlled within a predetermined temperature range.

Further, the configuration in which the transmissive heat exchange element is provided with the radiation member can also be adopted.

According to the present configuration, the heat radiation property of the high-temperature section of the transmissive heat exchange element can be improved.

Further, the optical element is preferably a polarization plate.

Although as the optical element to be the object of the temperature control, various kinds of elements such as a filter, a mirror, a lens, a lens array, a polarization conversion element, and a light modulation element can be considered, since the polarization plate is particularly easily charged with heat, it is effective to cool the polarization plate with the transmissive heat exchange element according to the invention. Further, since the transmissive heat exchange element can be disposed in the light path, it is also effective that the transmissive heat exchange element can be disposed in close contact with entire surface (entire surface of the area in which the light is input) of the polarization plate.

Alternatively, it is possible to adopt the configuration in which the transmissive heat exchange element is disposed on one surface of the polarization plate functioning as at least one of a polarizer and an analyzer of a light modulation element, the polarization plate is disposed on a near side to the light modulation element, and the transmissive heat exchange element is disposed on the far side from the light modulation element.

According to the present configuration, since the disturbance in the polarized light caused by the transmissive heat exchange element can be eliminated, and the harmful influence on the light modulation element can be suppressed, the contrast of the display image can be improved.

Further, as the transparent thermoelectric conversion layer, a layered body of strontium titanate and strontium titanate doped with niobium can be adopted.

According to the present configuration, high thermoelectric conversion efficiency and high transparency can be assured.

Further, it is preferable that the direction of the thermal conduction of the transmissive heat exchange element is the direction along the principal surface of the transmissive heat exchange element.

According to the present configuration, since the principal surface of the optical element to be the object of cooling is the same as the principal surface of the layered body of the transparent thermoelectric conversion substrate, increase in size of the transparent thermoelectric conversion substrate in accordance with the size of the optical element can be achieved with relative ease. Further, in the case in which the electrodes of the transmissive heat exchange element are disposed outside the light path, the electrodes are not necessarily required to be transparent, and the configuration in which the electrodes made of opaque metal or the like are used for transporting heat in the direction along the principal surface of the transmissive heat exchange element can be realized.

Further, the configuration in which the direction of the thermal conduction of the transmissive heat exchange element is the direction from the center portion of the principal surface of the transmissive heat exchange element towards the peripheral portion thereof.

According to the present configuration, the cooling can effectively be performed when using the configuration for the optical element having a tendency that the center portion particularly easily becomes high temperature.

A display device according to another aspect of the invention includes a transmissive heat exchange element having a transparent thermoelectric conversion layer consisting mainly of an oxide and an electrode for supplying the transparent thermoelectric conversion layer with a current, and an optical element, and cooling or heating of the optical element is performed using the transmissive heat exchange element.

According to this configuration, the display device achieving stabilization of the optical characteristics and increase in the operation life of the optical element can be realized by temperature-controlling the optical element using the transmissive heat exchange element.

BRIEF DESCRIPTION OF THE DRAWINGS

The invention will now be described with reference to the accompanying drawings, wherein like numbers reference like elements.

DESCRIPTION OF EXEMPLARY EMBODIMENTS

First Embodiment

Hereinafter, a first embodiment of the invention will be explained with reference to FIGS. 1, 2, 3A, and 3B.

The present embodiment is an example of a so-called three-panel liquid crystal projector provided with a liquid crystal light valve for each of the colored light beams, a red light beam (R), a green light beam (G), and a blue light beam (B).

Figure 1:
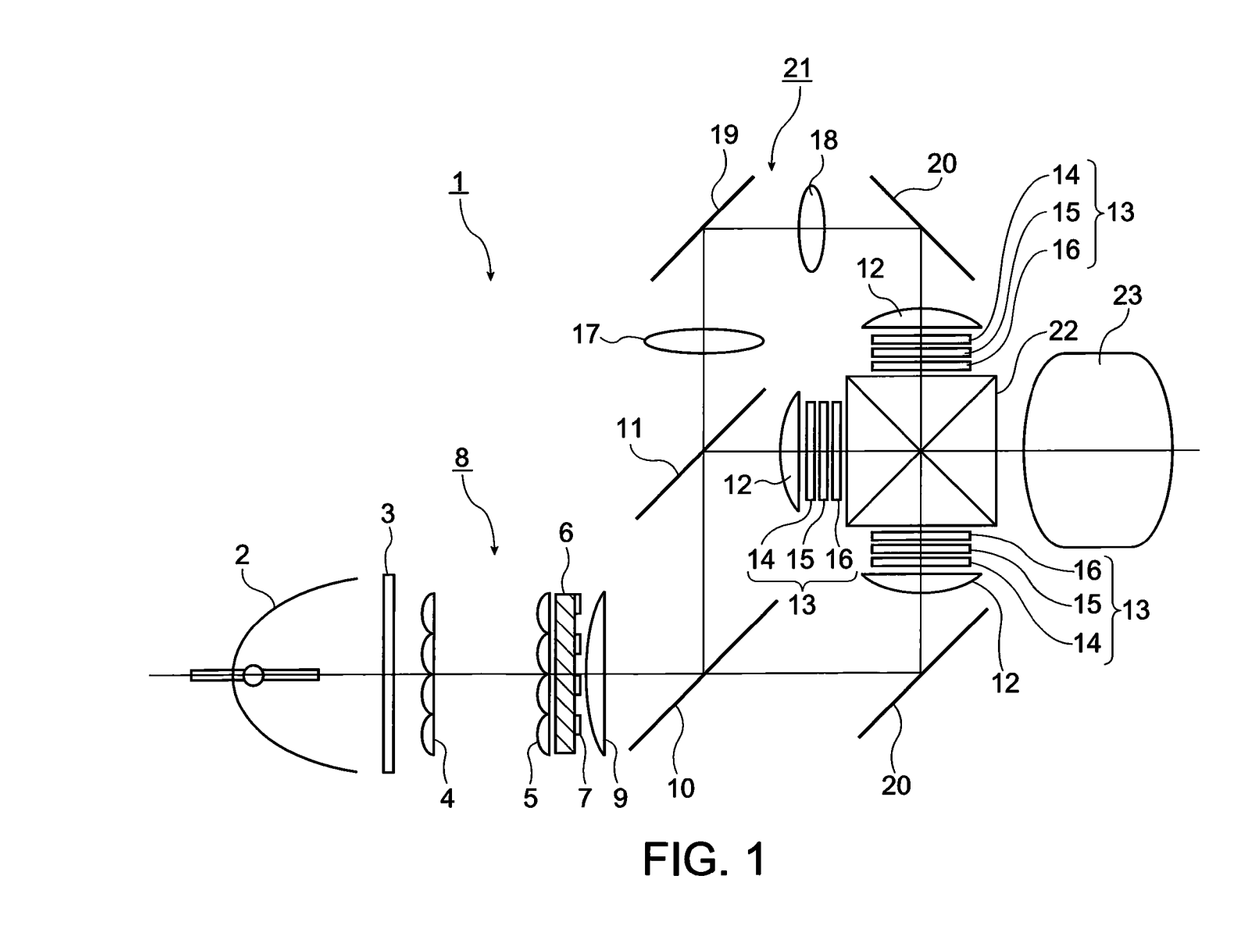
FIG. 1 is a schematic configuration diagram of a projector according to a first embodiment of the invention.
Figure 2:
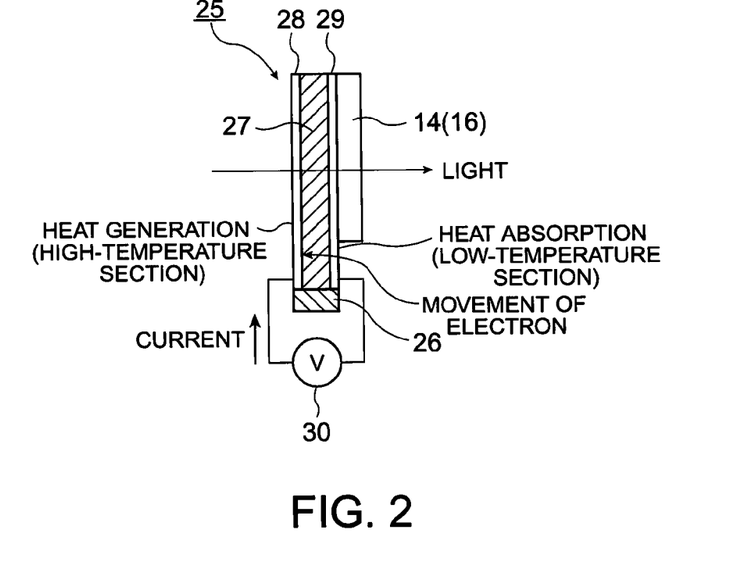
FIG. 2 is a diagram showing a usage configuration of a transparent thermoelectric conversion substrate used in the projector.
Figure 3A:
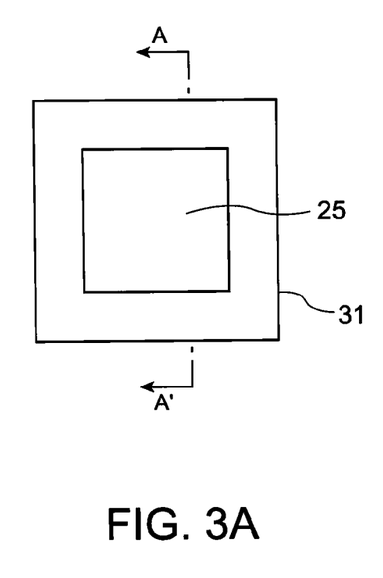
FIGS. 3A and 3B are diagrams showing another example of the usage configuration of the transparent thermoelectric conversion substrate.
Figure 3B:
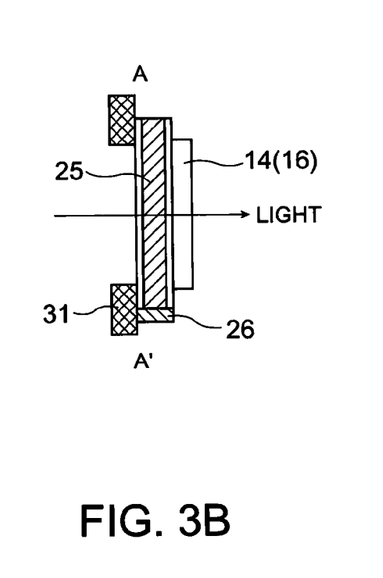

FIG. 1 is a schematic configuration diagram of the projector according to the present embodiment. FIGS. 2, 3A, and 3B are diagrams showing a usage configuration of a transparent thermoelectric conversion substrate used in the projector. It should be noted that in each of the drawings described below, the ratio, the scale size, and so on of each of the constituents are made different from each other in order for making the drawings eye-friendly.

In the projector 1 of the present embodiment, as shown in FIG. 1, a light source 2 is a high-intensity lamp such as a high-pressure mercury lamp, a xenon lamp, or a metal halide lamp, and the unpolarized light emitted from the light source 2 is removed of unnecessary ultraviolet light and infrared light reflected or absorbed by a UV/IR protection filter 3, thus the visible light available for image display is transmitted. As the UV/IR protection filter 3, what has a dielectric multilayer film formed on a transparent substrate such as a glass substrate, what has a material absorbing the light in a specific wavelength range included in the transparent substrate such as a glass substrate or formed on a substrate, and soon can be used. The UV/IR protection filter 3 is disposed nearest to the light source 2, and since heat is charged to the filter itself absorbing a part of the transmitted light, the material superior in heat resistance is preferably used therefor.

Subsequently, a polarization conversion integrator 8 having two lens arrays 4, 5, a polarized beam splitter (hereinafter abbreviated as PBS) array 6, and a retardation plate array 7 converts the unpolarized light into specific linearly polarized light, and at the same time, equalizes it in light intensity so that the illumination distribution in the illumination object (the liquid crystal valves) becomes substantially even. In other words, the light from the UV/IR protection filter 3 is divided into a plurality of partial light beams, and further, respectively collected by the two lens arrays 4, 5. Further, the light emitted from the lens array 5 enters the polarization splitting film of the PBS array 6 in a position-selecting manner to be separated into two kinds of linearly polarized light beams (P-polarized light beam and S-polarized light beam) having different polarization directions from each other, and then emitted with one of the linearly polarized light beams rotated in the polarization direction by the retardation plate array 7 to have the same polarization condition as that of the other of the linearly polarized light beams.

As the lens arrays 4, 5, there are used an integrated lens array formed by press molding, what is obtained by bonding a lens portion with a transparent substrate having high thermal conductivity, and so on. As the polarization splitting film of the PBS array 6, there is commonly used a dielectric multilayer film held between transparent substrates made of glass or the like having prism shapes. As the retardation plate array 7, there is commonly used an organic film having refractive index anisotropy attached to the substrate having a prism shape described above or a transparent substrate. The lens arrays 4, 5, the PBS array 6, the retardation plate array 7, and soon all absorb a part of light transmitted therethrough, and consequently, are charged inevitably with heat. Above all, since the retardation plate array 7 is formed of an organic film with low thermal resistance, the member having contact with the retardation plate array 7 is preferably made of a material with high thermal conductivity and superior in heat radiation property.

The light emitted from the polarization conversion integrator 8 is transmitted through an superimposing lens 9, separated by dichroic mirrors 10, 11 into three kinds of colored light beams (B-light beam, G-light beam, and R-light beam) with wavelength ranges different from each other, and the colored light beams enter the corresponding liquid crystal light valve units 13 via collimating lenses 12, respectively. As the dichroic mirrors 10, 11, there are used transparent substrates made of glass or the like each provided with a dielectric multilayer film.

The liquid crystal light valve units 13 are each provided commonly with a entrance side polarization plate 14, a liquid crystal light valve 15, and an exit side polarization plate 16. The entrance side polarization plate 14 (a polarizer) converts the illumination light into a predetermined polarized light beam by absorbing or reflecting unnecessary polarization components, and emits the predetermined polarized light beam, the liquid crystal light valve 15 modulates the input polarized light beam in accordance with the information from the outside to generate a polarized light added with phase information, and the exit side polarization plate 16 (an analyzer) converts it into intensity information corresponding to the phase information by absorbing or reflecting unnecessary polarization components, thus forming the display image. As the light absorbing polarization plate, there is used, for example, what is obtained by uniaxially aligning a polymer including dye or iodine on a transparent substrate made of glass or resin. As the light reflecting polarization plate, there is used, for example, what is obtained by periodically arranging thin metallic wires on a transparent substrate made of glass or the like. In principle, since significant heat charge is caused in the polarization plates 14, 16 by light absorption (without mentioning the light absorbing polarization plate, light absorption is also inevitable in the light reflecting polarization plate), the material superior in heat resistance and heat radiation property is preferably used.

Further, as the liquid crystal light valve 15, there is used what is provided with a TFT substrate having thin film transistors (TFT), signal wiring, a light blocking film, and so on formed on a transparent substrate made of glass or the like, an opposed substrate having an opposed electrode, a light blocking film, and so on formed on a transparent substrate made of glass or the like, and a liquid crystal layer held between the substrates described above (not shown). Since also in the liquid crystal light valve 15, the heat charge is caused in the light blocking film, the signal wiring, and so on by light absorption, the material superior in heat resistance and the heat radiation property is preferably used.

It should be noted that various kinds of retardation plates for correcting the phase condition of the light might be used in a liquid crystal light valve unit 13 if necessary. Since an organic film with the refractive index anisotropy is commonly used as the retardation plate, the material with high thermal conductivity and superior in heat radiation property is also used preferably for the substrate of the retardation plate. Further, for the purpose of preventing the phenomenon that the dust or the like attached to the surface of the liquid crystal light valve 15 appears in the display image as a shadow, a dust-proof transparent substrate is disposed in close contact with the liquid crystal light valve 15 in some cases.

One colored light beam (e.g., the B-light beam) of the three colored light beams thus separated enters the liquid crystal light valve unit 13 via a relay optical system 21 including a collimating lens 17, a relay lens 18, reflecting mirrors 19, 20 in order for making the optical length of the illumination light path be equivalent to those of the other two colored light beams. It should be noted here that since the illumination light is collected inside the relay lens 18, heat strain is easily caused to make the transmission of the illumination light beam distribution inaccurate, thus easily causing a variation in illumination. Therefore, the material with small photoelastic constant and superior in the heat radiation property is preferably used for the relay lens 18 so as not to cause the heat strain.

The colored light beams provided with the image information are respectively emitted from the corresponding liquid crystal light valve units 13, combined by the cross dichroic prism 22, and then projected on a projection surface by a projection lens 23, thus the color image is formed. As the cross dichroic prism 22, what is obtained by forming the dielectric multilayer films in the gaps between the four triangular prisms made of glass or the like.

It should be noted that a light absorbing color filter for preventing the light from entering from the rear surface side of the liquid crystal light valve 15 is disposed between the cross dichroic prism 22 and the liquid crystal light valve unit 13 if necessary. As the light absorbing color filter, there is used, for example, what is obtained by making a transparent substrate made of glass or the like include the material absorbing the light in a predetermined wavelength range or by forming such a material on the substrate. Since the light absorption causes the heat charge in the light absorbing color filter, the material superior in heat resistance and heat radiation property is preferably used therefor.

Further, on the entrance side (the light source side) of the liquid crystal light valve unit 13, there is disposed a dichroic color filter for improving the color purity of the incident colored light beam if necessary. As the dichroic color filter, there is used, for example, what is obtained by making a transparent substrate made of glass or the like include the material reflecting or absorbing the light in a predetermined wavelength range or by forming such a material on the substrate. Since the light absorption causes the heat charge in the color filter of this kind, the material superior in heat resistance and heat radiation property is preferably used therefor.

FIG. 2 shows a fundamental usage configuration of the transparent thermoelectric conversion substrate 25 (a transmissive heat exchange element).

The strontium titanate group transparent thermoelectric conversion substrate 25 of the present embodiment has a transparent strontium titanate substrate as a support substrate 26, and is obtained by forming a layered body 27 on the support substrate 26, the layered body 27 (a transparent thermoelectric conversion layer) having niobium-substituted strontium titanate, in which a part of titanium is substituted with niobium by doping niobium, and strontium titanate alternately stacked as layers a plurality of times. Further, on the two principal surfaces of the transparent thermoelectric conversion substrate 25 opposed to each other, there are formed transparent electrodes 28, 29 using indium tin oxide (hereinafter abbreviated as ITO) or the like, and a direct-current power supply 30 is connected thereto via the transparent electrodes 28, 29.

The transparent thermoelectric conversion substrate 25 formed of the layered body 27 of niobium-substituted strontium titanate and strontium titanate has features of being transparent in the visible range, having strong thermal electromotive force (high cooling capacity), and being superior in heat resistance with a melting point of 2000° C. or more, and consequently, is preferably used in the optical system of the projector. It should be noted that the layered body 27 can be formed by alternately depositing niobium-substituted strontium titanate and strontium titanate as layers using a sputtering process or a laser deposition process. Here, although the strontium titanate substrate, which is substantially transparent in the visible range, is used as the support substrate 26 in consideration of, for example, matching with the crystal lattices of the constituent materials of the layered body 27, the support substrate 26 is not necessarily limited thereto. The support substrate is not required to be transparent in the case in which the part including the support substrate 26 is disposed outside the light path, and an opaque substrate can also be used therefor. Further, in the case in which the complete matching with the crystal lattices of the constituent materials of the layered body 27 is not required, other crystalline or non-crystalline substrates can be used.

When a direct-current electrical current is applied in a predetermined direction from the direct-current power supply 30, energy transmission caused by the Peltier effect is excited along the thickness direction of the transparent thermoelectric conversion substrate 25, and as a result, there is caused a temperature distribution such that one side of the transparent thermoelectric conversion substrate 25 becomes a low temperature section while the other thereof becomes a high temperature section. Therefore, if the optical element (the entrance side polarization plate 14 and the exit side polarization plate 16 of the liquid crystal light valve unit 13 in the present embodiment) to be the object of cooling is disposed in close contact with the low temperature section of the transparent thermoelectric conversion substrate 25, the optical element can be cooled. Further, the temperature distribution provided to the transparent thermoelectric conversion substrate 25 varies in accordance with the polarity of the current applied to the transparent thermoelectric conversion substrate 25. In other words, when the direct-current electrical current is applied in the opposite direction to the direction described above, the side, which has been the low temperature section before, changes to the high temperature section, and the side, which has been the high temperature section before, changes to the low temperature section. By using this phenomenon, the optical element can not only be cooled, but also be heated or kept in a constant temperature.

Since most of the liquid crystal light valves control the polarization condition of the light thereby performing image display, the polarization plates 14, 16 (polarizers) are disposed in front of and behind the liquid crystal light valve 15 as described above. The polarization plates 14, 16 are elements for selectively transmitting or reflecting a certain kind of polarized light beam thereby generating the light beam having a specific polarization state, and a light absorbing polarization plate obtained by forming a polarization body having iodine or dye oriented together with a polymer on a transparent substrate, or a light reflecting polarization plate having a dielectric multilayer film formed on a transparent substrate, for example, is commonly used therefor. Above all, for the transmissive liquid crystal light valve 15 used in the projector shown in FIG. 1, the light absorbing polarization plate is commonly used in view of usability and cost reduction. The light absorbing polarization plate is an element having a polarization body obtained by uniaxially aligning the dye molecules or iodine molecules in a polymer held between a pair of transparent resin films (support members) made of triacetylcellulose (TAC) or the like. However, since the light absorbing polarization plate absorbs unnecessary polarized light by the polarization body, in the case in which the light with strong intensity is input, the polarization plate is significantly charged with heat, and as a result, deterioration in the polarization characteristics and reduction of the operation life are caused. Therefore, if the polarization plate 14, 16 (in particular the light absorbing polarization plate with the significant heat charge) can efficiently be cooled, improvement of the image quality of the projection image and increase in operation life of the projector can be realized.

Therefore, as shown in FIG. 2, by bonding the polarization plate 14, 16 to one surface of the transparent thermoelectric conversion substrate 25 with a transparent adhesive, and applying a direct-current electrical current to the transparent thermoelectric conversion substrate 25, the heat generated in the polarization plate 14, 16 can rapidly be absorbed, thereby cooling the polarization plate 14, 16. Specifically, the temperature distribution is formed so that the surface of the transparent thermoelectric conversion substrate 25 with which the polarization plate 14, 16 has contact becomes the low temperature section while the other surface thereof becomes the high temperature section, thus the heat generated by the polarization plate 14, 16 is absorbed by the low temperature section to be transferred to the high temperature section, and then diffused in the air. As the transparent adhesive, an adhesive with high thermal conductivity including, for example, a conductive polymer having an electron conjugated system is preferable. As described above, by adopting the polarization plate 14, 16 provided with the transparent thermoelectric conversion substrate 25, even in the case in which the light with strong intensity is input, the heat charge in the polarization plate 14, 16 is reduced to prevent the temperature of the polarization plate from rising, thus the prevention of the deterioration in the polarization characteristics and the increase in the operation life of the polarization plate can be realized.

Although the transparent thermoelectric conversion substrate 25 is capable of transmitting the light, it might disturb the polarization state when transmitting the light. Therefore, in order for minimizing the influence provided to the polarization characteristics by the transparent thermoelectric conversion substrate 25, it is necessary to consider the entrance direction of the light to be transmitted. Specifically, in the case with the polarization plate 14 used in the entrance side of the light modulation element such as the liquid crystal light valve 15, the entrance direction of the light or the orientation of the polarization plate should be set so that the light enters the transparent thermoelectric conversion substrate 25 side and is transmitted through the polarization plate 14 to be emitted therefrom. On the other hand, in the case with the polarization plate 16 used in the exit side of the light modulation element such as the liquid crystal light valve 15, the entrance direction of the light or the orientation of the polarization plate should be set so that the light enters the polarization plate 16 side and is transmitted through the transparent thermoelectric conversion substrate 25 to be emitted therefrom. In other words, it is preferable that the polarization plate 14, 16 is disposed on the side near to the liquid crystal light valve 15, and the transparent thermoelectric conversion substrate 25 is disposed on the side far from the liquid crystal light valve 15. By adopting such a positional configuration, the influence provided to the polarization characteristics by the transparent thermoelectric conversion substrate 25 can be kept to the minimum, and consequently, the polarization plate superior in the polarization characteristics can easily be realized. It should be noted that although the transparent electrodes are formed on both surfaces of the transparent thermoelectric conversion substrate 25, the surface through which the light is transmitted out of the air interfaces is preferably provided with an antireflection film, thereby increasing the transmission as the polarization plate 14, 16 to realize high efficiency of the light. Further, in the case of using the reflective liquid crystal light valve, it is required to dispose a polarizer (e.g., reflective polarization plate) for polarization selection on the light entrance side (and the light exit side) of the reflective liquid crystal light valve in order for selecting the polarized light (the polarizer functions as the both of the polarizer and the analyzer of the light modulation element), and similarly in such a case, it is preferable that the polarizer is disposed on the side near to the liquid crystal light valve while the transparent thermoelectric conversion substrate is disposed on the side far from the liquid crystal light valve.

It should be noted that in view of the polarization characteristics and the heat radiation property, the polarization plate having a configuration of directly forming the polarization body on the transparent thermoelectric conversion substrate 25 is more preferable. Specifically, since the transparent resin film, which is a support member and made of triacetylcellulose (TAC) or the like, has low thermal conductivity to be provided with a heat capacity, it is apt to store heat. Therefore, by using the transparent thermoelectric conversion substrate 25 itself as the support member instead of the transparent resin film, and disposing the polarization body directly on the transparent thermoelectric conversion substrate 25 in close contact therewith, the heat generated in the polarization body can further efficiently be conducted to the transparent thermoelectric conversion substrate 25.

In order for rapidly cooling the polarization plate 14, 16, it is preferable to have a mechanism capable of diffusing the heat transferred to the high-temperature section of the transparent thermoelectric conversion substrate 25 rapidly in the air. Therefore, as shown in FIGS. 3A, 3B, a radiation fin 31 (radiating member) shaped like a frame is preferably disposed on the opposite surface to the surface of the transparent thermoelectric conversion substrate 25 having contact with the polarization plate 14, 16 (elements to be cooled). Here, FIG. 3A is a front elevation view of the transparent thermoelectric conversion substrate 25 viewed from the light entrance side thereof, and FIG. 3B is a cross-sectional view along the A-A' line of FIG. 3A. As the radiation fin 31, a structure using aluminum or copper superior in thermal conductivity and having a number of fine grooves on the surface thereof so as to increase the surface area is preferable. Further, in bonding with the transparent thermoelectric conversion substrate 25, an adhesive superior in thermal conductivity including a thermal-conductive filler or the like is preferably used. Thus, since the heat transferred to the high temperature section of the transparent thermal conversion substrate 25 can efficiently be diffused, the polarization plate 14, 16 as the elements to be cooled disposed in close contact with the low temperature section thereof can more efficiently be cooled.

Second Embodiment

Hereinafter, a second embodiment of the invention will be explained with reference to FIG. 4.

The fundamental configuration of the projector of the present embodiment is the same as that of the first embodiment, and the only difference is the usage configuration of the transparent thermoelectric conversion substrate. The present embodiment also shows an example of the structure for cooling the polarization plate.

Figure 4:
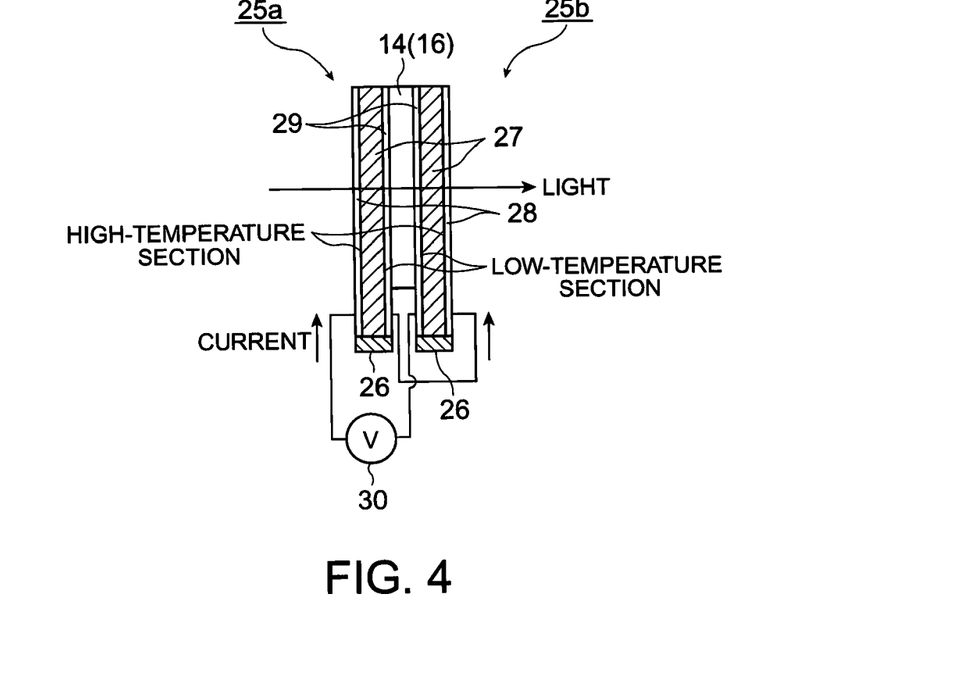
FIG. 4 is a diagram showing a usage configuration of a transparent thermoelectric conversion substrate according to a second embodiment of the invention.

FIG. 4 is a diagram showing a usage configuration of a transparent thermoelectric conversion substrate in the projector of the present embodiment.

In the present embodiment, as shown in FIG. 4, the configuration of holding the polarization plate 14, 16 (or the polarization body) between a pair of transparent thermoelectric conversion substrates 25a, 25b is described. In other words, the both sides (both of the light entrance surface side and the light exit surface side) of the polarization plate 14, 16 (or the polarization body) are provided with the transparent thermoelectric conversion substrates 25a, 25b, respectively. In this case, it is arranged that the direct-current electrical currents respectively flow through the pair of transparent thermoelectric conversion substrates 25a, 25b in the directions opposite to each other so that the sides of the transparent thermoelectric conversion substrates 25a, 25b having contact with the polarization plate 14, 16 (or the polarization body) always become the low-temperature sections. Although it is possible to connect the direct-current power supply 30 to each of the pair of transparent thermoelectric conversion substrate

25a, 25b, in the present embodiment, the side of the one transparent thermoelectric conversion substrate 25a having contact with the polarization plate 14, 16 (or the polarization body) and the opposite side of the other transparent thermoelectric conversion substrate 25b to the side thereof having contact with the polarization plate 14, 16 (or the polarization body) are connected with wiring, and the opposite side of the one transparent thermoelectric conversion substrate 25a to the side thereof having contact with the polarization plate 14, 16 (or the polarization body) and the side of the other transparent thermoelectric conversion substrate 25b having contact with the polarization plate 14, 16 (or the polarization body) are connected to the direct-current power supply 30. According to this configuration, it is possible to apply the direct-current electrical current to the pair of transparent thermoelectric conversion substrates 25a, 25b in directions opposite to each other using only one direct-current power supply 30.

Also in the present embodiment, there can be obtained the same advantage as in the first embodiment that improvement in the image quality of the projection image and increase in the operation life of the projector can be realized by cooling the polarization plates 14, 16. Further, in the case with the present embodiment, since the polarization plate 14, 16 (or the polarization body) can be cooled from the both sides, even in the case in which the light with extremely strong intensity is input, the heat charge can be reduced to effectively prevent the temperature from rising.

Third Embodiment

Hereinafter, a third embodiment of the invention will be explained with reference to FIG. 5.

The fundamental configuration of the projector of the present embodiment is the same as that of the first embodiment, and the only difference is the usage configuration of the transparent thermoelectric conversion substrate. The present embodiment also shows an example of the structure for cooling the polarization plate.

Figure 5:
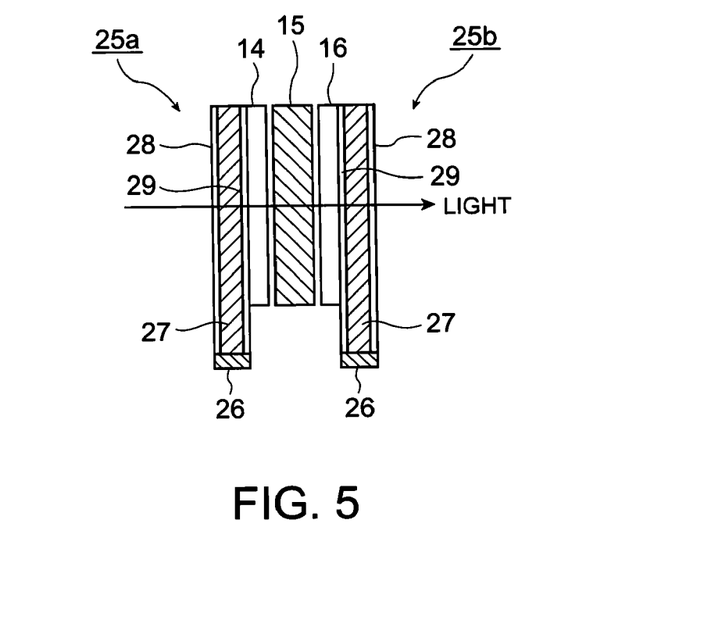
FIG. 5 is a diagram showing a usage configuration of a transparent thermoelectric conversion substrate according to a third embodiment of the invention.

FIG. 5 is a diagram showing a usage configuration of a transparent thermoelectric conversion substrate in the projector of the present embodiment.

In the present embodiment, as shown in FIG. 5, there is described the configuration of the case in which the polarization plates 14, 16 respectively provided with the transparent thermoelectric conversion substrates 25a, 25b are used while being disposed in front of and behind the liquid crystal light valve 15. In this case, each of the polarization plates 14, 16 is preferably disposed with a slight gap (e.g., approximately 0.1 through 5 mm) from the liquid crystal light valve 15, thus the heat generated in the polarization plates 14, 16 can be prevented from being transferred to the liquid crystal light valve 15 to exert harmful influence on the optical characteristics.

Further, regarding the positional relationship between the polarization bodies in the polarization plates 14, 16 and the transparent thermoelectric conversion substrates 25a, 25b, it is preferable to dispose the polarization plates 14, 16 (the polarization bodies) so as to always position nearer to the liquid crystal light valve 15 than the transparent thermoelectric conversion substrates 25a, 25b. It is preferable that the polarization state is not influenced by other mediums than the polarization bodies in the vicinity of the liquid crystal light valve 15, and according to the present positional configuration, the transparent thermoelectric conversion substrates 25a, 25b whose possibility of exerting influence on the polarization state is not necessarily nil are positioned outside the pair of polarization plates 14, 16 for determining the polarization state with respect to the liquid crystal light valve 15. Therefore, the phenomenon such as optical rotation or elliptical polarization which happens when the polarized light adjusted by the polarization plates 14, 16 is transmitted through the transparent thermoelectric conversion substrates 25a, 25b, can be eliminated, and further the possibility that the transparent thermoelectric conversion substrates 25a, 25b exert influence on the state of the polarized light entering the liquid crystal light valve 15 can be eliminated as much as possible, and consequently, the display contrast of the liquid crystal light valve 15 can easily be improved.

It should be noted that although the pair of polarization plates 14, 16 are disposed with a slight distance from the liquid crystal light valve 15 in the usage configuration shown in FIG. 5, even in the case in which the pair of polarization plates 14, 16 are disposed in close contact with the liquid crystal light valve 15, since the transparent thermoelectric conversion substrates 25a, 25b are superior in cooling property, the heat charge of the liquid crystal light valve 15 can effectively be prevented. In the case in which the present positional configuration is adopted, since the distances from the liquid crystal display surface (a liquid crystal layer) of the liquid crystal light valve 15 to the air interfaces of the transparent thermoelectric conversion substrates 25a, 25b become long, even in the case in which dust is attached to the air interfaces (the surfaces) of the transparent thermoelectric conversion substrates 25a, 25b, the phenomenon that the dust appears in the display image as a shadow can be prevented.

Although the transparent electrodes are formed on both surfaces of the transparent thermoelectric conversion substrates 25a, 25b, the surfaces through which the light is transmitted out of the air interfaces are each preferably provided with an antireflection film, thereby increasing the transmission as the polarization plate 14, 16 to realize further high efficiency of the light.

Fourth Embodiment

Hereinafter, a fourth embodiment of the invention will be explained with reference to FIG. 6.

The fundamental configuration of the projector of the present embodiment is the same as that of the first embodiment, and the only difference is the usage configuration of the transparent thermoelectric conversion substrate. The present embodiment shows an example of the structure for cooling the liquid crystal light valve.

Figure 6:
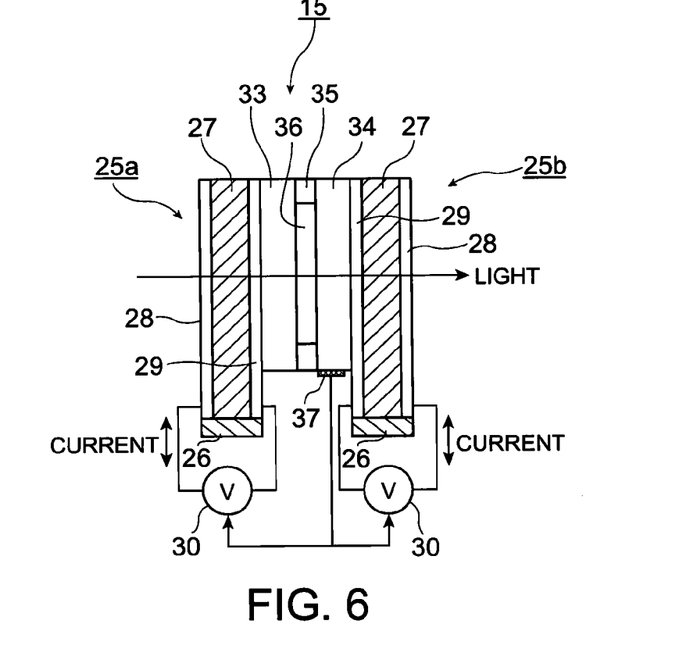
FIG. 6 is a diagram showing a usage configuration of a transparent thermoelectric conversion substrate according to a fourth embodiment of the invention.

FIG. 6 is a diagram showing a usage configuration of a transparent thermoelectric conversion substrate in the projector of the present embodiment.

In the present embodiment, as shown in FIG. 6, there is described the case in which the transparent thermoelectric conversion substrates 25a, 25b are disposed in front of and behind the liquid crystal light valve 15 to perform cooling or temperature control of the liquid crystal light valve 15. The liquid crystal light valve 15 has a structure composed of a TFT substrate 34 located on the exit side and having pixel electrodes, signal wiring, switching elements, a light blocking film for blocking light on the switching elements, and so on formed on a transparent substrate, an opposed substrate 33 located on the entrance side and having a opposed electrode, a light blocking film, and so on formed on a transparent substrate, and a liquid crystal layer 36 encapsulated in the gap between the both substrates 33, 34 by the seal section 35. Therefore, if the light with strong intensity enters, heat generation is caused mainly in the light blocking films and the signal wiring to cause heat charge of the liquid crystal light valve 15 itself, thus causing the deterioration in the characteristics and reduction of the operation life of the elements. Accordingly, it is desired to efficiently cool also the liquid crystal light valve 15. It should be noted that since the speed of the response of the liquid crystal has temperature dependency, and the lower the temperature is, the lower the speed of the response becomes, excessive cooling causes significant deterioration in the display image. Therefore, the cooling temperature is preferably controlled so that the liquid crystal light valve 15 is used in a predetermined temperature range.

In view of the background described above, in the liquid crystal light valve 15 shown in FIG. 6, the transparent thermoelectric conversion substrates 25a, 25b are disposed on both of the opposed substrate 33 side as the light entrance side and the TFT substrate 34 side as the light exit side, and further a temperature sensor 37 (a temperature detection section) is provided to the liquid crystal light valve 15, thus the cooling control is performed based on the temperature information from the temperature sensor 37 so that the element temperature of the liquid crystal light valve 15 falls within a predetermined temperature range. It should be noted that the installation position of the temperature sensor 37 is preferably in the vicinity (i.e., the TFT substrate 34 side) of the switching element or the liquid crystal layer 36 with characteristics having the temperature dependency, but is not limited thereto. For example, it is possible to locate it at a section mainly causing heat generation or in the vicinity thereof. Further, in the case in which there are two or more sections mainly causing heat generation, a plurality of temperature sensors corresponding there to can be disposed. On this occasion, there is adopted a configuration of connecting the direct-current power supplies 30 respectively to the transparent thermoelectric conversion substrate 25a on the opposed substrate 33 side and the transparent thermoelectric conversion substrate 25b on the TFT substrate 34 side, and separately controlling the amounts of the currents from the respective direct-current power supply 30 based on the temperature information from the temperature sensor 37. Thus, the temperature control of the opposed substrate 33 and the temperature control of the TFT substrate 34 can also be performed separately. If there is no need for performing the temperature control separately between the opposed substrate 33 and the TFT substrate 34, the configuration of providing only one direct-current power supply 30 as shown in FIG. 4 can also be adopted.

The transparent thermoelectric conversion substrates 25a, 25b are preferably installed with a gap of no greater than 0.1 mm from the liquid crystal light valve 15, and sealed so that no dust comes into the gap sections. In the liquid crystal light valve 15, the optical characteristics are significantly influenced by a slight variation of the thickness (cell thickness) of the liquid crystal layer 36, and since in the most liquid crystal light valves the cell thickness is maintained by a seal section on the periphery thereof without using the cell thickness adjusting member such as beads, when strong heat stress acts on the opposed substrate 33 or the TFT substrate 34, degradation of the image quality of the display image is easily caused. Therefore, by providing the slight gaps between the liquid crystal light valve 15 and the transparent thermoelectric conversion substrates 25a, 25b, the heat stress caused by the temperature variation or thermal expansion and so on can be prevented from directly acting on the liquid crystal light valve 15, thus the degradation in the image quality can be prevented. Meanwhile, since the smaller gaps are preferable for efficiently conducting the heat generated in the liquid crystal light valve 15 to the transparent thermoelectric conversion substrates 25a, 25b, by setting the gaps to be no greater than 0.1 mm, the both advantages described above can be obtained.

It should be noted that besides the case in which the transparent thermoelectric conversion substrates 25a, 25b are disposed with an enclosed space structure, there can be adopted the structure in which the liquid crystal light valve 15 and the transparent thermoelectric conversion substrates 25a, 25b are bonded each other via a transparent adhesive member with high flexibility (i.e., small Young's modulus). In this case, if the thickness of the transparent adhesive member is no greater than several tens of micrometers, the influence exerted by the transparent adhesive member to the light transmitted therethrough is little or nothing, the thermal conductivity is hardly damaged, and there is little chance for the heat stress thus generated to influence each other between the liquid crystal light valve 15 and the transparent thermoelectric conversion substrates 25a, 25b.

Further, by disposing the transparent thermoelectric conversion substrates 25a, 25b in front of and behind the liquid crystal light valve 15, the distances from the liquid crystal display surface (the liquid crystal layer 36) of the liquid crystal light valve 15 to the air interfaces of the transparent thermoelectric conversion substrates 25a, 25b become longer, and consequently, even if dust is attached to the air interfaces (the surfaces) of the transparent thermoelectric conversion substrates 25a, 25b, the phenomenon that the dust appears in the display image as a shadow can be prevented. Further, the antireflection films are preferably formed on both surfaces of the transparent thermoelectric conversion substrate 25a, 25b, and thus the transmission can be enhanced to realize the further high efficiency of the light. Still further, in order for efficiently diffusing the heat in the high-temperature sections of the transparent thermoelectric conversion substrates 25a, 25b, the radiation fins are preferably installed in the peripheries of the surfaces of the transparent thermoelectric conversion substrates 25a, 25b on the opposite side to the liquid crystal light valve 15.

It should be noted that even by the configuration of disposing the transparent thermoelectric conversion substrate 25a, 25b on either one of the entrance side and the exit side with respect to the liquid crystal light valve 15, it is possible to efficiently cooling or executing the temperature control on the liquid crystal light valve 15.

Fifth Embodiment

Hereinafter, a fifth embodiment of the invention will be explained with reference to FIG. 7.

The fundamental configuration of the projector of the present embodiment is the same as that of the first embodiment, and the only difference is the usage configuration of the transparent thermoelectric conversion substrate. The present embodiment shows an example of the structure for cooling the liquid crystal light valve.

Figure 7:
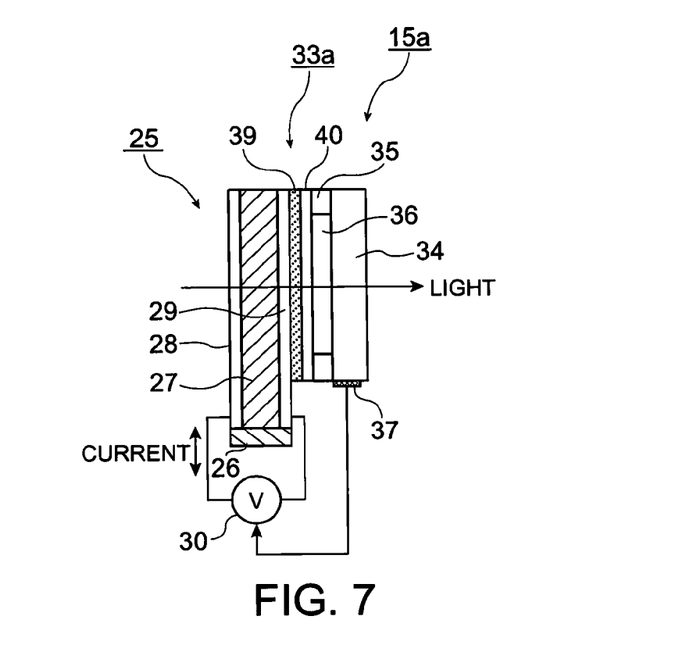
FIG. 7 is a diagram showing a usage configuration of a transparent thermoelectric conversion substrate according to a fifth embodiment of the invention.

FIG. 7 is a diagram showing a usage configuration of a transparent thermoelectric conversion substrate in the projector of the present embodiment.

In the first through the fourth embodiments, the optical element as the object of cooling (the temperature control) is left as it is without executing any works thereon, and the transparent thermoelectric conversion substrate is disposed in the vicinity of the optical element to perform cooling or temperature control. In contrast, the present embodiment is an example of the configuration in which the transparent thermoelectric conversion substrate is also used as the support substrate of the optical element.

FIG. 7 shows the configuration in the case in which the transparent thermoelectric conversion substrate 25 is used as the opposed substrate 33a of the liquid crystal light valve 15a. On one surface (the surface on the liquid crystal layer 36 side) of the transparent thermoelectric conversion substrate 25, there are stacked a transparent electrode 29 for forming the temperature distribution, an insulating layer 39 made of $SiO_2$ or the like, and a opposed electrode 40 (a transparent electrode) for driving the liquid crystal layer 36 in this order from the substrate. Thus, the transparent electrode 29 for forming the temperature distribution and the opposed electrode 40 for driving the liquid crystal layer are in the condition of being electrically isolated from each other by the insulating layer 39. The opposed substrate 40 on the transparent thermoelectric conversion substrate 25 and the TFT substrate 34 hold the liquid crystal layer 36 in between together with the seal section 35, thus forming the liquid crystal light valve 15a.

Further, the cooling control is performed so that the element temperature of the liquid crystal light valve 15a falls within the predetermined temperature range based on the temperature information from the temperature sensor 37 attached to the TFT substrate 34 (or the opposed substrate 33a in the vicinity of the liquid crystal layer 36). As described above, by using the transparent thermoelectric conversion substrate 25 as the opposed substrate 33a, the heat generated in the signal wiring and the light blocking films is efficiently reduced and diffused, thus the heat charge of the liquid crystal light valve 15a can efficiently be prevented. Here, in order for efficiently diffusing the heat in the high-temperature section of the transparent thermoelectric conversion substrate 25, the radiation fin is preferably installed in the periphery of the surface of the transparent thermoelectric conversion substrate 25 as the opposed substrate 33a on the opposite side to the liquid crystal layer 36. It should be noted that it is possible to form the liquid crystal light valve using the transparent thermoelectric conversion substrate 25 as the transparent substrate on the TFT substrate 34 side, or using the transparent thermoelectric conversion substrate 25 as both of the opposed substrate 33a and the TFT substrate 34.

Besides the above, in the projector 1 shown in FIG. 1, the transparent thermoelectric conversion substrate 25 can be used at least one of the transparent substrate of the UV/IR protection filter 3, the transparent substrates of the lens arrays 4, 5, the transparent substrate of the retardation plate array 7, the transparent substrates of the dichroic mirrors 10, 11, the transparent substrate for supporting the relay lens 18, the transparent substrates of the polarization plates 14, 16, the dust-proof transparent substrate for the liquid crystal light valve 15 and so on, the transparent substrate for the light absorbing color filter or the dichroic color filter. These optical elements easily cause the heat generation or the heat charge, and have the optical characteristics and the operation lives easily influenced by the thermal effects. Therefore, by using the transparent thermoelectric conversion substrate 25 as the transparent substrates described above, it becomes possible to effectively diffuse the heat generated in each of the optical elements to prevent the heat charge, thus the thermal effects can be suppressed.

Sixth Embodiment

Hereinafter, a sixth embodiment of the invention will be explained with reference to FIGS. 8A and 8B.

The fundamental configuration of the projector of the present embodiment is the same as that of the first embodiment, and the only difference is the usage configuration of the transparent thermoelectric conversion substrate. The present embodiment shows an example of the structure for cooling the polarization plate.

Figure 8A:
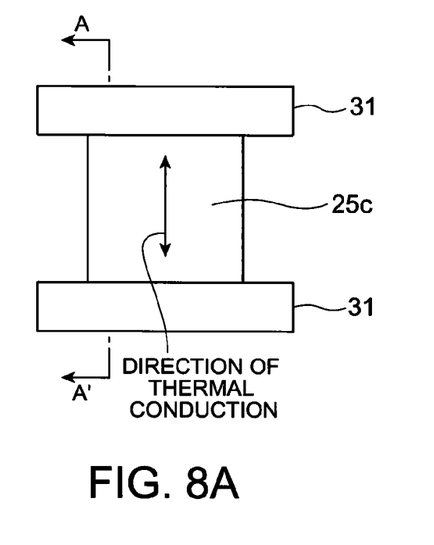
FIGS. 8A and 8B are diagrams showing a usage configuration of a transparent thermoelectric conversion substrate according to a sixth embodiment of the invention.
Figure 8B:
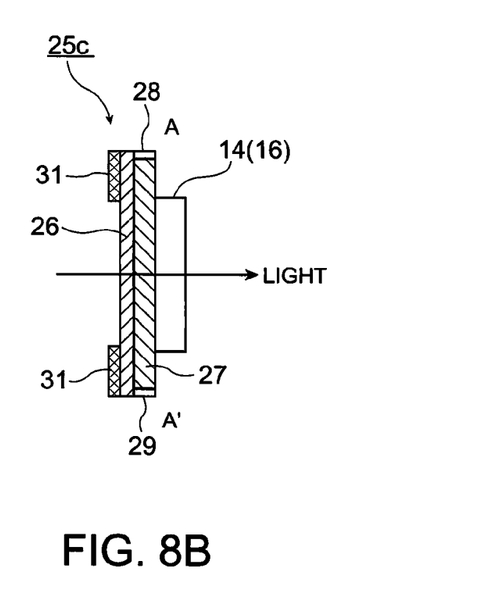

FIGS. 8A and 8B are diagrams showing a usage configuration of a transparent thermoelectric conversion substrate in the projector of the present embodiment. FIG. 8A is a front elevation view of the transparent thermoelectric conversion substrate viewed from the light entrance side thereof, and FIG. 8B is a cross-sectional view along the A-A' line of FIG. 8A.

In the first through the fifth embodiment, the current is applied in the thickness direction of the transparent thermoelectric conversion substrate to excite the energy transmission, thereby forming the temperature distribution to perform the thermal conduction. In contrast, the present embodiment is an example of setting the direction parallel to the principal surface of the transparent thermoelectric conversion substrate to the direction of the thermal conduction. As shown in FIG. 8B, in the present embodiment, a transparent strontium titanate substrate is used as the support substrate 26, and the layered body 27 having niobium-substituted strontium titanate and strontium titanate stacked alternately a plurality of times is formed on the support substrate 26. Although in the first through the fifth embodiment, the stacking direction (the thickness direction of each of the layers) of niobium-substituted strontium titanate and strontium titanate and the transmission direction of the light are perpendicular to each other, in the present embodiment, the stacking direction (the thickness direction of each of the layers) and the transmission direction of the light is parallel to each other. Therefore, although in the first through the fifth embodiment, there is a description that the support substrate of the transparent thermoelectric conversion substrate is not necessarily required to be transparent, in the present embodiment, since the light is inevitably transmitted through the support substrate 26 in the present embodiment, the support substrate 26 is required to be transparent.

A pair of electrodes 28, 29 for forming the temperature distribution are formed on the both ends of the transparent thermoelectric conversion substrate 25c. Although in the first through the fifth embodiments, the light is transmitted through the electrodes, and therefore the transparent electrodes need to be used, in the present embodiment, the electrodes 28, 29 are not required to be transparent in the case in which the electrodes 28, 29 are disposed outside the light path, and the electrodes made of opaque metal can also be used. According to such a configuration, as shown in FIG. 8A, the direction of the thermal conduction becomes the direction along (substantially parallel to the principal surface, either upward or downward in the sheet corresponding to the current direction) the principal surface of the transparent thermoelectric conversion substrate 25c. Further, the radiation fins 31 each having a rectangular plate shape are provided to the both sides of the transparent thermoelectric conversion substrate 25c on the sides to which the electrodes 28, 29 are disposed. In the case with the present embodiment, the direction of the thermal conduction becomes the vertical direction in FIG. 8A. Although it is sufficient to provide the radiation fin 31 to one end to be the high-temperature section, here, the radiation fins 31 are provided to the both ends of the transparent thermoelectric conversion substrate 25c so as to be able to correspond to the case in which the direction of the thermal conduction is switched to either directions.

Seventh Embodiment

Hereinafter, a seventh embodiment of the invention will be explained with reference to FIGS. 9A and 9B.

The fundamental configuration of the projector of the present embodiment is the same as that of the first embodiment, and the only difference is the usage configuration of the transparent thermoelectric conversion substrate. The present embodiment shows an example of the structure for cooling the polarization plate.

Figure 9A:
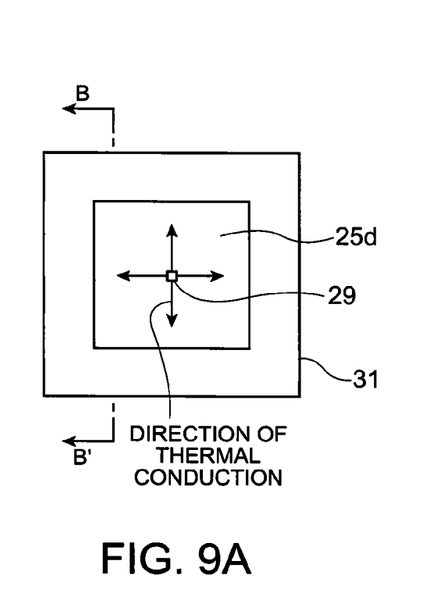
FIGS. 9A and 9B are diagrams showing a usage configuration of a transparent thermoelectric conversion substrate according to a seventh embodiment of the invention.
Figure 9B:
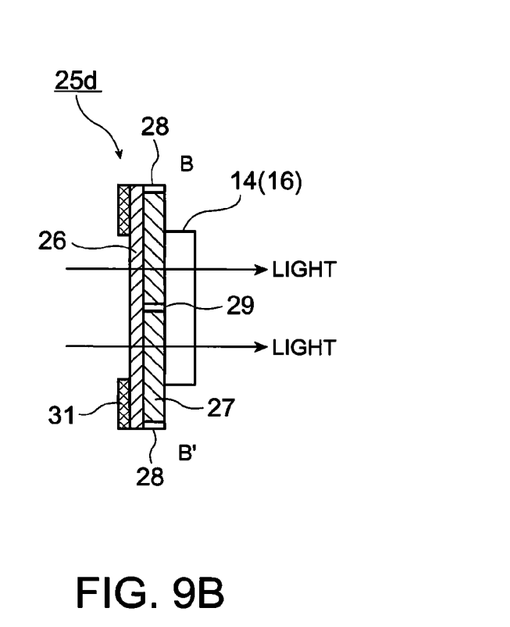

FIGS. 9A and 9B are diagrams showing a usage configuration of a transparent thermoelectric conversion substrate in the projector of the present embodiment. FIG. 9A is a front elevation view of the transparent thermoelectric conversion substrate viewed from the light entrance side thereof, and FIG. 9B is a cross-sectional view along the B-B' line of FIG. 9A.

Similarly to the sixth embodiment, the present embodiment is also an example of setting the direction parallel to the principal surface of the transparent thermoelectric conversion substrate to the direction of the thermal conduction. It should be noted that the difference from the sixth embodiment is that the pair of electrodes 28, 29 are disposed on the both ends of the transparent thermoelectric conversion substrate 25c on the one hand, in the present embodiment, as shown in FIG. 9B, the pair of electrodes 28, 29 are respectively disposed at the center portion and on the peripheral portion of the transparent thermoelectric conversion substrate 25d on the other hand. The electrode 29 at the center portion is disposed so as to be built-in at the center portion of the layered body 27, and is made of a transparent conductive material such as ITO. The electrode 28 on the peripheral portion is disposed on the periphery of the layered body 27 to have a frame shape, and the electrode 28 can be made of a transparent material, or made of a opaque material.

According to the configuration described above, as shown in FIG. 9A, the direction of the thermal conduction becomes parallel to the principal surface of the transparent thermoelectric conversion substrate 25d, and the direction from the center portion of the transparent thermoelectric conversion substrate 25d towards the periphery thereof. Further, the frame like radiation fin 31 is disposed on the periphery of the transparent thermoelectric conversion substrate 25d. In the case of the present embodiment, although it is preferable that the direction of the thermal conduction is basically from the center portion of the transparent thermoelectric conversion substrate 25d towards the periphery thereof, as the case may be, the direction from the periphery of the transparent thermoelectric conversion substrate 25d to the center portion thereof can be adopted.

According to the configurations of the sixth and the seventh embodiments, since the principal surface of the optical element, which is the object to be cooled, becomes the same as the principal surfaces of the layered bodies 27 of the transparent thermoelectric conversion substrates 25c, 25d, there is obtained the advantage that the size of the transparent thermoelectric conversion substrate 25c, 25d can easily be increased in accordance with the size of the optical element. Further, such a configuration as in the seventh embodiment is particularly preferable when it is used for the optical element having a tendency that the temperature of the center portion is apt to become high.

Eighth Embodiment

Hereinafter, an eighth embodiment of the invention will be explained with reference to FIG. 10.

In the present embodiment, an example of a liquid crystal display will be explained as the display device.

Figure 10:
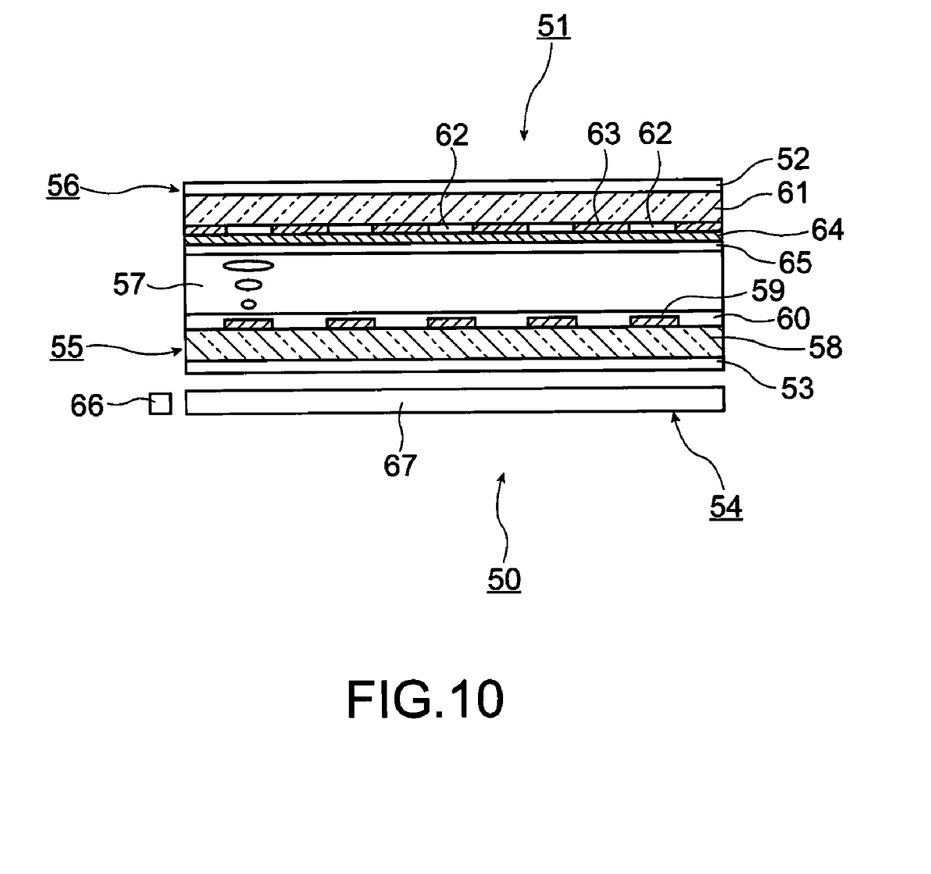
FIG. 10 is a diagram showing a schematic configuration of a display device according to an eighth embodiment of the invention.

FIG. 10 is a cross-sectional view showing the liquid crystal display of the present embodiment.

As shown in FIG. 10, the liquid crystal display 50 of the present embodiment is composed mainly of a liquid crystal panel 51, polarization plates 52, 53 disposed above and below the liquid crystal panel 51, and a backlight 54. The liquid crystal panel 51 is composed of a TFT substrate 55, a opposed substrate 56, and a liquid crystal layer 57 held between the TFT substrate 55 and the opposed substrate 56. On the inside surface (the surface on the liquid crystal layer 57 side) of the transparent substrate 58 forming the TFT substrate 55, there are formed data lines, signal lines such as the scan lines, and TFT (all not shown) for switching pixels, and further pixel electrodes 59, an oriented film 60, and so on are also formed thereon. Meanwhile, on the inside surface (the surface on the liquid crystal layer 57 side) of the transparent substrate 61 forming the opposed substrate 56, there are formed a color filter including a colored layer 62 and a black matrix 63, an opposed electrode 64, an oriented film 65, and so on. Further, the outside surfaces of the TFT substrate 55 and the opposed substrate 56 (the surfaces on the opposite side to the liquid crystal layer 57) are respectively provided with polarization plates 52, 53. In the outside of the polarization plate 53 on the TFT substrate 55 side, there is disposed the backlight 54 including a light source 66 and a light guide plate 67.

Also in the liquid crystal display 50 of the present embodiment, the transparent thermoelectric conversion substrate described in the first through the seventh embodiments can be used as a measure for cooling or temperature-controlling the polarization plates 52, 53 and the liquid crystal panel 51. Further, the transparent thermoelectric conversion substrate described above can be used as a measure for cooling or temperature-controlling a light emitting display device such as an electroluminescence device besides the liquid crystal display.

It should be noted that the scope of the invention is not limited to the embodiments described above, but various modifications can be executed thereon within the range of the scope or the spirit of the invention. For example, although in the embodiments described above, the example of cooling or temperature-controlling the polarization plate or the liquid crystal light valve, as the optical element to be the object of cooling or temperature control, there can be cited various filters, mirrors, lenses, lens arrays, polarization conversion elements, polarization plates (polarizers), retardation films, and so on. Further, the temperature sensor is not limited to be used in the liquid crystal light valve, but can preferably be used in the optical element using an organic material with large thermal expansion such as a polarization plate (a polarizer), or a retardation plate.

Further, the transparent thermoelectric conversion substrate can be used for a reflective liquid crystal light valve or a mirror array element (e.g., DMD produced by Texas Instruments Inc.) provided with a number of micromirrors besides the transmissive liquid crystal light valve described above, and the same advantages can be expected. In the case with the reflecting element such as the reflective liquid crystal light valve or the mirror array element, although an ordinary or a past Peltier element can be used if the cooling is performed in the opposite side to the light entrance side, the transparent thermoelectric conversion substrate described above can be installed on the light entrance side of the reflective element to cool the element. Thus, since the optical element can be cooled from the light entrance (exit) side, which is apt to become higher temperature, advantages derived therefrom such as improvement of cooling efficiency and downsizing of the projector can be obtained. Further, in the case in which the projector or the display device is used in an extremely low temperature environment (in particular on start-up), it is possible to actively heat the optical element such as the liquid crystal light valve using the transparent thermoelectric conversion substrate in the aim of improvement of display characteristics.

The entire disclosure of Japanese Patent Application No. 2007-214511, filed Aug. 21, 2007 is expressly incorporated by reference herein.

What is claimed is:

1. A projector comprising:
a transmissive heat exchange element having a transparent thermoelectric conversion layer consisting mainly of an oxide and an electrode for supplying the transparent thermoelectric conversion layer with a current; and
an optical element,
wherein one of cooling and heating of the optical element is performed using the transmissive heat exchange element.

2. The projector according to claim 1,
wherein the transmissive heat exchange element is disposed one of in close contact with and adjacent to the optical element.

3. The projector according to claim 2,
wherein the transmissive heat exchange element is disposed each of both surfaces of the optical element, and
a temperature distribution of the transmissive heat exchange element is formed so that the side of the transmissive heat exchange element opposed to the optical element becomes a low temperature side.

4. The projector according to claim 1,
wherein the transmissive heat exchange element is used as a transparent substrate forming the optical element.

5. The projector according to claim 1, further comprising:
a temperature detection section for detecting the temperature of the optical element,
wherein the current is controlled based on a detection result of the temperature detection section, thereby controlling the temperature of the transmissive heat exchange element.

6. The projector according to claim 1,
wherein the transmissive heat exchange element is provided with a radiation member.

7. The projector according to claim 1,
wherein the optical element is a polarization plate.

8. The projector according to claim 7,
wherein the transmissive heat exchange element is disposed on one surface of the polarization plate functioning as at least one of a polarizer and an analyzer of a light modulation element,
the polarization plate is disposed on a near side to the light modulation element, and
the transmissive heat exchange element is disposed on a far side from the light modulation element.

9. The projector according to claim 1,
wherein the transparent thermoelectric conversion layer is mainly composed of a layered body of strontium titanate and strontium titanate doped with niobium.

10. The projector according to claim 1,
wherein a direction of a thermal conduction of the transmissive heat exchange element is a direction along a principal surface of the transmissive heat exchange element.

11. The projector according to claim 10,
wherein the direction of the thermal conduction of the transmissive heat exchange element is a direction from a center portion to a peripheral portion of the principal surface of the transmissive heat exchange element.

12. A display device comprising:
a transmissive heat exchange element having a transparent thermoelectric conversion layer consisting mainly of an oxide and an electrode for supplying the transparent thermoelectric conversion layer with a current; and
an optical element,
wherein one of cooling and heating of the optical element is performed using the transmissive heat exchange element.

* * * * *